United States Patent
Otsuka et al.

(10) Patent No.: US 8,432,010 B2
(45) Date of Patent: Apr. 30, 2013

(54) SOLID-STATE IMAGE PICKUP DEVICE, METHOD OF MANUFACTURING SOLID-STATE IMAGE PICKUP DEVICE, AND ELECTRONIC APPARATUS

(75) Inventors: Youichi Otsuka, Kanagawa (JP); Kazuaki Ogawa, Kanagawa (JP); Taichi Natori, Kanagawa (JP); Atsushi Yamamoto, Kumamoto (JP); Yasunori Koshino, Kumamoto (JP); Hitomi Kamiya, Kanagawa (JP); Yoshinori Toumiya, Kanagawa (JP); Tadayuki Dofuku, Kumamoto (JP); Ina Hori, Kumamoto (JP); Takayuki Shoya, Kumamoto (JP); Yukihiro Sayama, Kagoshima (JP); Masaya Shimoji, Kumamoto (JP); Yoshikazu Tanaka, Kumamoto (JP)

(73) Assignee: Sony Corporation (JP)

( * ) Notice: Subject to any disclaimer, the term of this patent is extended or adjusted under 35 U.S.C. 154(b) by 244 days.

(21) Appl. No.: 12/769,799

(22) Filed: Apr. 29, 2010

(65) Prior Publication Data
US 2010/0289100 A1    Nov. 18, 2010

(30) Foreign Application Priority Data
May 15, 2009 (JP) ................................. 2009-118162

(51) Int. Cl.
*H01L 31/14* (2006.01)

(52) U.S. Cl.
USPC ...................... 257/432; 257/98; 257/E33.068

(58) Field of Classification Search .................. 257/225, 257/431–440, 290–294, E33.068, E3.073, 257/E27.133, E27.134, E27.135, E27.142, 257/E25.032, E31.127, 232, 96–103, E33.073; 438/68–70, 72

See application file for complete search history.

(56) References Cited

U.S. PATENT DOCUMENTS

| | | | |
|---|---|---|---|
| 8,049,289 B2 * | 11/2011 | Park ............................... | 257/432 |
| 2007/0030380 A1 * | 2/2007 | Higuchi et al. ............... | 348/340 |
| 2008/0191333 A1 * | 8/2008 | Yang et al. ..................... | 257/680 |
| 2009/0267270 A1 * | 10/2009 | Murakami et al. ............ | 264/447 |

FOREIGN PATENT DOCUMENTS

| | | |
|---|---|---|
| JP | 06-232379 | 8/1994 |
| JP | 2007-053153 | 3/2007 |
| JP | 2007-053324 | 3/2007 |

* cited by examiner

*Primary Examiner* — Cuong Q Nguyen
*Assistant Examiner* — Yosef Gebreyesus
(74) *Attorney, Agent, or Firm* — Sheridan Ross P.C.

(57) ABSTRACT

Disclosed herein is a solid-state image pickup device including a solid-state image pickup element operable to produce an electric charge according to the amount of light received, a lens disposed on the upper side of a pixel of the solid-state image pickup element, a protective film which covers the upper side of the lens and a surface of which is flattened, and a surface film which is formed at the surface of the protective film and which is higher in hydrophilicity than the inside of the protective film.

6 Claims, 13 Drawing Sheets

FIG.5E
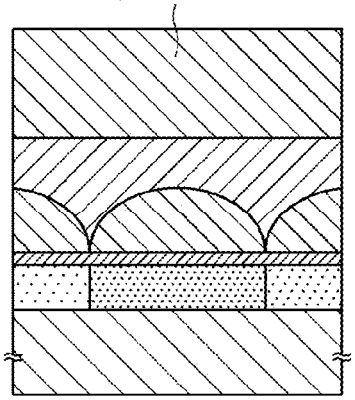
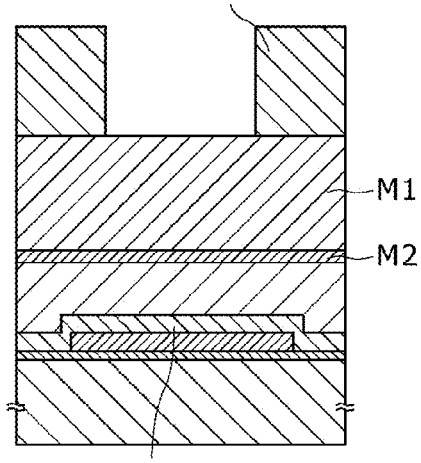
FIG.5F
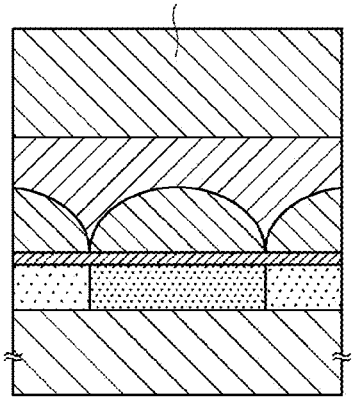
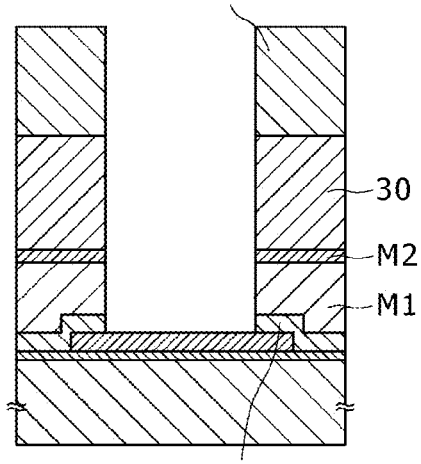
FIG.5G
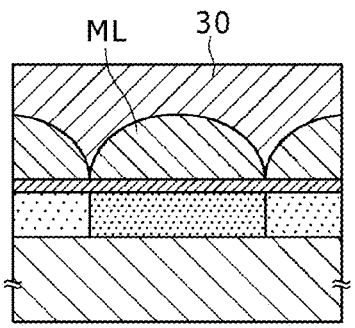
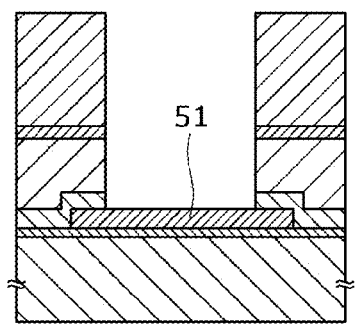

FIG. 6E
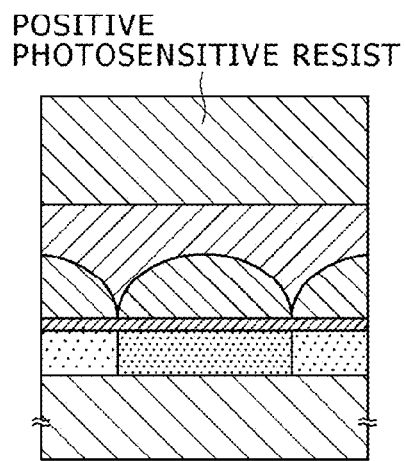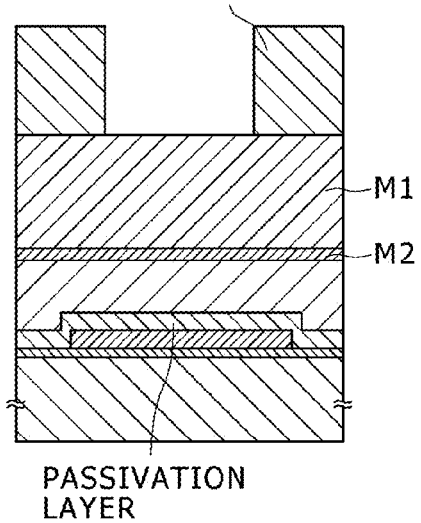
FIG. 6F
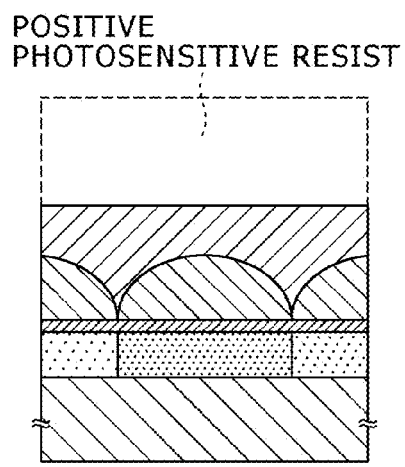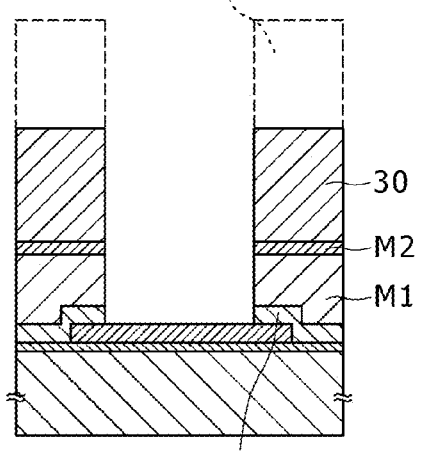
FIG. 6G
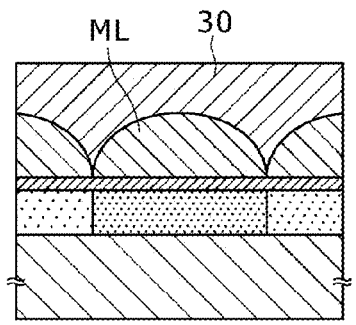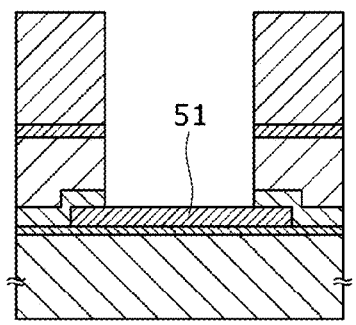

F I G . 8

|  | FLUORINE-CONTAINING SILOXANE RESIN -1 | FLUORINE-CONTAINING SILOXANE RESIN -2 | FLUORINE-CONTAINING ACRYLIC RESIN |
|---|---|---|---|
| BEFORE SURFACE TREATMENT | REPELLENCE OF WATER, OBSERVED | REPELLENCE OF WATER, OBSERVED | REPELLENCE OF WATER, OBSERVED |
| AFTER 20 HOURS FROM SURFACE TREATMENT | REPELLENCE OF WATER, ABSENT | REPELLENCE OF WATER, ABSENT | SLIGHT REPELLENCE OF WATER, OBSERVED |
| AFTER 50 HOURS FROM SURFACE TREATMENT | REPELLENCE OF WATER, ABSENT | REPELLENCE OF WATER, ABSENT | REPELLENCE OF WATER, OBSERVED |
| AFTER 100 HOURS FROM SURFACE TREATMENT | REPELLENCE OF WATER, ABSENT | REPELLENCE OF WATER, ABSENT | REPELLENCE OF WATER, OBSERVED |
| AFTER 200 HOURS FROM SURFACE TREATMENT | REPELLENCE OF WATER, ABSENT | REPELLENCE OF WATER, ABSENT | REPELLENCE OF WATER, OBSERVED |

FIG.10

FLUORINE-CONTAINING SILOXANE RESIN

ELEMENTAL CONCENTRATION RATIO (atomic%)

| TREATMENT | C | N | O | F | Si |
|---|---|---|---|---|---|
| COATING+200°C×5minutes BAKING | 36.57 | 0.00 | 32.15 | 13.25 | 13.25 |
| COATING+200°C×5minutes BAKING + SURFACE TREATMENT | 8.01 | 0.29 | 64.19 | 1.94 | 25.57 |

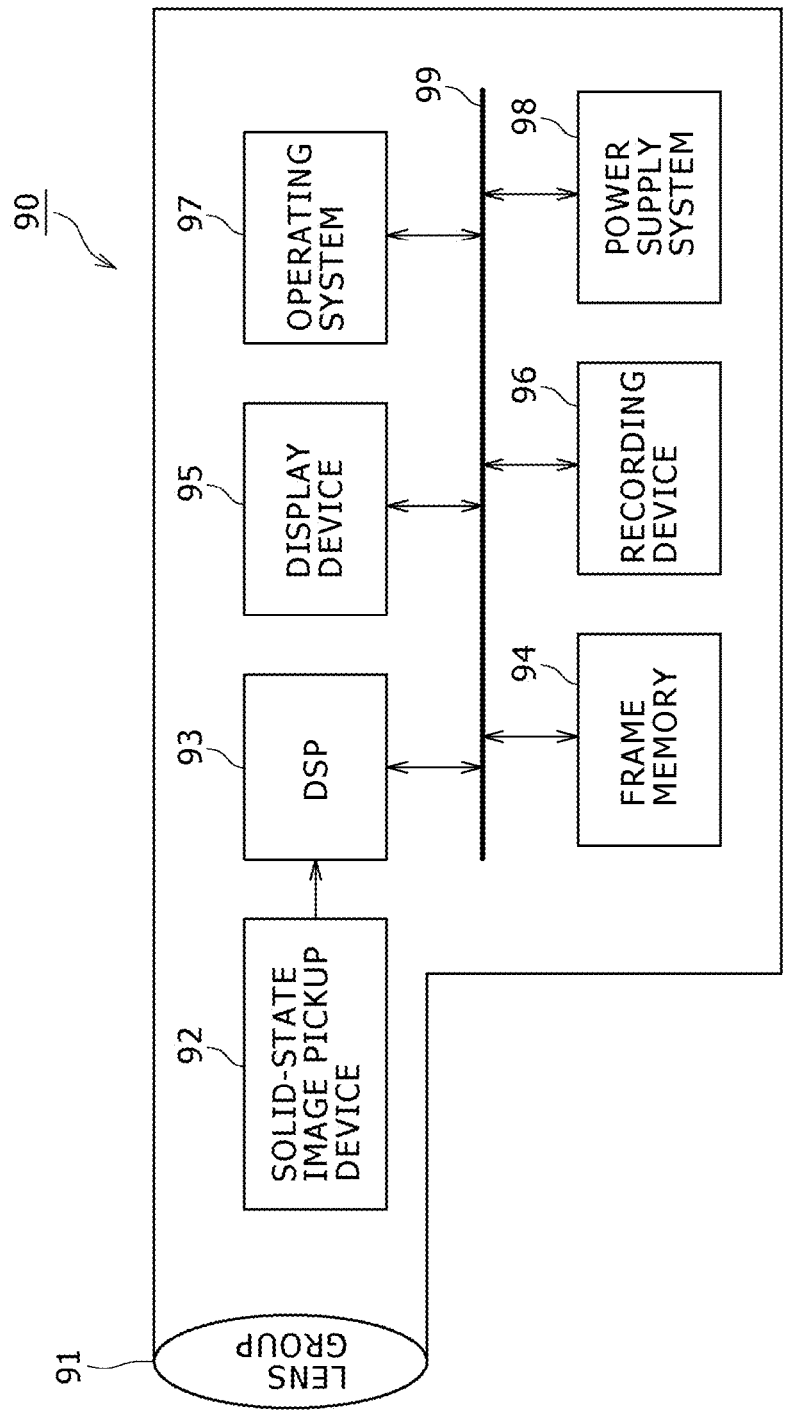

SOLID-STATE IMAGE PICKUP DEVICE, METHOD OF MANUFACTURING SOLID-STATE IMAGE PICKUP DEVICE, AND ELECTRONIC APPARATUS

BACKGROUND OF THE INVENTION

1. Field of the Invention

The present invention relates to a solid-state image pickup device, a method of manufacturing a solid-state image pickup device, and an electronic apparatus. More specifically, the invention relates to a solid-state image pickup device, a method of manufacturing a solid-state image pickup device, and an electronic apparatus in which deposition of dust on an optical path during the manufacture of the device or apparatus is prevented.

2. Description of the Related Art

There has been disclosed a technology in which a flattening film lower in refractive index than microlenses of a solid-state image pickup element is disposed on the microlenses, and the flattening film is used as a protective film to thereby prevent deposition of dust and to provide hermetic seal between the solid-state image pickup element and a transparent substrate, thereby reducing reflection at interfaces and increasing the sensitivity of the image pickup element.

For example, Japanese Patent Laid-Open No. Hei 6-232379 referred to as Patent Document 1 hereinafter describes a configuration in which a transparent flat film having water repellency and oil repellency is provided at an outermost layer of a solid-state image pickup element. It is shown that this configuration enables easy cleaning of dust or the like deposited on the outermost layer of the solid-state image pickup element. It is also shown that the transparent flat film has a low surface energy, so that contamination with dust or the like is suppressed.

Besides, Japanese Patent Laid-Open No. 2007-53153 referred to as Patent Document 2 hereinafter describes a configuration in which a flat layer of a fluoro acrylic resin is formed on microlenses of a solid-state image pickup element, and the surface of the flat layer is roughened. It is shown that by this configuration it is possible to reduce or obviate deposition of dust or foreign matter during later steps such as dicing or module fabrication.

Furthermore, Japanese Patent Laid-Open No. 2007-53324 referred to as Patent Document 3 hereinafter describes a structure of a solid-state image pickup element in which a fluorine-containing resin material layer is provided on microlenses of the image pickup element, a resin layer is provided over the fluorine-containing resin material layer, and a transparent substrate is disposed over the resin layer. It is shown that this structure makes it possible, by appropriately determining the refractive indexes of the layers, to reduce reflected components of the light incident on the solid-state image pickup element, and promises an increased sensor sensitivity. It is also shown that, by eliminating an air layer between the solid-state image pickup element and the transparent substrate, deposition of dust or the like during transportation of a solid-state image pickup device is prevented.

SUMMARY OF THE INVENTION

However, in the case where a transparent flat film having water repellency and oil repellency is provided at an outermost layer of a solid-state image pickup element, washing water used at the time of wafer dicing is not sufficiently distributed to the wafer surface and, therefore, it may be impossible to achieve satisfactory removal of dust. In addition, when the surface of a flat layer provided on microlenses is roughened, a preventive effect on dust deposition may not be obtained.

Thus, there is a desire to prevent deposition of dust during manufacture of a solid-state image pickup device, thereby providing a desired product having excellent optical characteristics.

According to an embodiment of the present invention, there is provided a solid-state image pickup device including a solid-state image pickup element operable to produce an electric charge according to the amount of light received, a lens disposed on the upper side of a pixel of the solid-state image pickup element, a protective film which covers the upper side of the lens and a surface of which is flattened, and a surface film which is formed at the surface of the protective film and which is higher in hydrophilicity than the inside of the protective film.

In this embodiment, in a configuration wherein a lens is disposed on the upper side of each pixel of a solid-state image pickup element and the lenses are covered with a protective film having a flattened surface, a surface film higher in hydrophilicity than the inside of the protective film is provided at the surface of the protective film. The hydrophilic nature of the surface of the protective film promises uniform distribution of washing water to the surface of the protective film during a manufacturing process, whereby dust can be removed assuredly.

While the surface film higher in hydrophilicity than the inside of the protective film is provided at the surface of the protective film, a surface film lower in hydrophobic nature than the inside of the protective film may also be provided, to yield a similar effect to the above-mentioned. Specifically, where the protective film is formed from a fluorine-containing resin, the surface film is lower in fluorine content than the inside of the protective film.

The protective film may be formed from a fluorine-containing silane compound, a fluorine-containing siloxane resin, or a fluorine-containing siloxane resin admixed with silica particulates having voids therein.

Examples of the surface film include a film or layer formed by subjecting the protective film to a plasma treatment using an oxygen-containing gas.

According to another embodiment of the present invention, there is provided a method of manufacturing a solid-state image pickup device, including the steps of forming a lens on the upper side of a pixel of a solid-state image pickup element, covering the lens with a protective film and flattening a surface of the protective film, and forming at the surface of the protective film a surface film which is higher in hydrophilicity than the inside of the protective film.

In this embodiment, since the surface film higher in hydrophilic nature than the inside of the protective film is provided at the protective film, washing water is uniformly distributed to the surface of the protective film during cleaning of the protective film surface using washing water in the manufacturing process of the solid-state image pickup device. Consequently, dust can be removed securely.

According to a further embodiment of the present invention, there is provided an electronic apparatus including a solid-state image pickup device, and a signal processing unit operable to process a signal based on an electric charge produced by the solid-state image pickup device. The solid-state image pickup device includes a solid-state image pickup element operable to produce an electric charge according to the amount of light received, a lens disposed on the upper side of a pixel of the solid-state image pickup element, a protective film which covers the upper side of the lens and a surface of which is flattened, and a surface film which is formed at the surface of the protective film and which is higher in hydrophilicity than the inside of the protective film.

In this embodiment, in an electronic apparatus using a solid-state image pickup device wherein a lens is disposed on each pixel of a solid-state image pickup element and the lenses are covered with a protective film having a flattened surface, a surface film higher in hydrophilic nature than the inside of the protective film is provided at the surface of the protective film. Due to the presence of the surface film, uniform distribution of washing water to the surface of the protective film during the manufacturing process is promised by the hydrophilic nature of the surface of the protective film. Accordingly, dust can be removed assuredly.

Thus, according to embodiments of the present invention, it is possible to prevent dust deposition during manufacture of a solid-state image pickup device, particularly, during a wafer dicing step, and to provide a desired product having excellent optical characteristics.

BRIEF DESCRIPTION OF THE DRAWINGS

FIGS. 5A to 5G are schematic sectional diagrams for illustrating a process flow (No. 1) of a method of manufacturing a solid-state image pickup device according to an embodiment of the invention;

FIGS. 6A to 6G are schematic sectional diagrams for illustrating a process flow (No. 2) of a method of manufacturing a solid-state image pickup device according to an embodiment of the invention;

FIG. 8 is a table showing the results of visual checking of wettability in a dicing treatment;

FIG. 10 is a table showing an example of element concentration ratios according to the presence or absence of a surface treatment of a protective film;

FIG. 12 is a block diagram showing a configuration example of an image pickup apparatus as one example of an electronic apparatus according to an embodiment of the invention.

DETAILED DESCRIPTION OF THE PREFERRED EMBODIMENTS

Now, a mode for carrying out the present invention (hereinafter, referred to as "embodiment") will be described below. The descriptions will be made in the following order.
1. Structure of solid-state image pickup device (an example of plan-view structure of main part, an example of mounting of package, an example of configuration on the upper side of pixel, and an example of plan-view configuration of chip)
2. Method of manufacturing solid-state image pickup device (examples of process flow, No. 1 and No. 2 thereof)
3. Investigation of effects of the embodiment (contents of investigation, results of investigation, and elemental analysis of protective film and surface film)
4. Comparison between the related art and the embodiment (comparison between Patent Document 3 and this embodiment)
5. Examples of application to various microlenses (spherical, aspheric, rectangular and diffraction examples)
6. Electronic apparatus (example of application to image pickup device)

1. Structure of Solid-State Image Pickup Device

Figure 1:
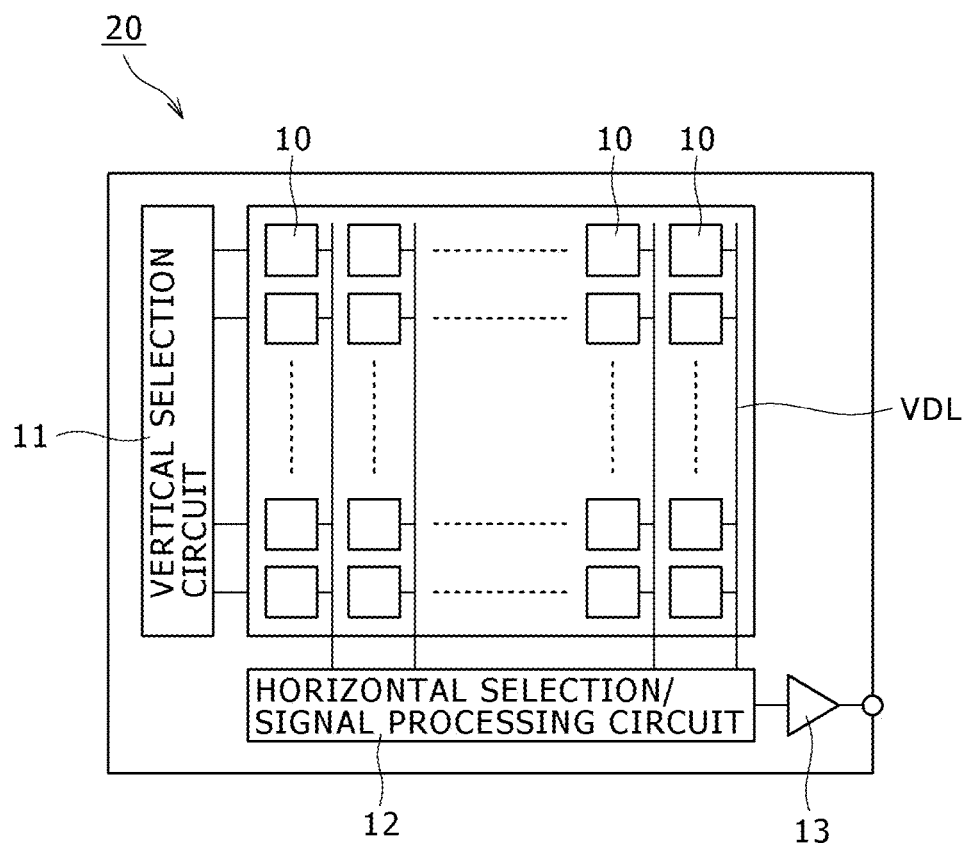
FIG. 1 is a schematic plan view of an example of a solid-state image pickup element constituting a main part of a solid-state image pickup device according to an embodiment of the present invention.

Plan-View Structure of Main Part of Solid-State Image Pickup Device According to This Embodiment FIG. 1 is a schematic plan view for illustrating an example of a solid-state image pickup element constituting a main part of a solid-state image pickup device according to this embodiment. The solid-state image pickup element 20 includes a plurality of pixels 10, vertical signal lines VDL, a vertical selection circuit 11, a horizontal selection/signal processing circuit 12, and an output circuit 13.

The plurality of pixels 10 are arranged in a matrix pattern on a semiconductor substrate such as a silicon substrate. Each of the pixels 10 has a light receiving part (photodiode) operable to produce an electric charge according to the amount of light received, and a peripheral circuit including various transistors.

Each of the vertical signal line VDL is a wiring for sending a signal according to the electric charge taken in by each pixel 10 to the horizontal selection/signal processing circuit 12, and is arrayed along the vertical direction in the matrix arrangement of the pixels 10. The vertical selection circuit 11 is a circuit for selecting the pixels 10 on a row basis, and performing a sequential scan along the vertical direction.

The horizontal selection/signal processing circuit 12 is a circuit which selects the pixels 10 on a column basis and performs sequential scan along the horizontal direction, and is a circuit for processing signals sent thereto through the vertical signal line VDL. The horizontal selection/signal processing circuit 12 sequentially selects the pixels 10 arrayed along the horizontal direction, synchronously with the scan conducted by the vertical selection circuit 11. According to the order of selections, the signals of the pixels 10 are sequentially sent to the horizontal selection/signal processing circuit 12 through the vertical signal lines VDL. The horizontal selection/signal processing circuit 12 sends to the output circuit 13 the signals of the pixels 10 sequentially sent thereto.

The output circuit 13 performs various signal processings on the signals of the pixels 10 sequentially sent from the horizontal selection/signal processing circuit 12, and outputs the resulting signals.

[Package Mounting Example of Solid-State Image Pickup Device]

Figure 2:
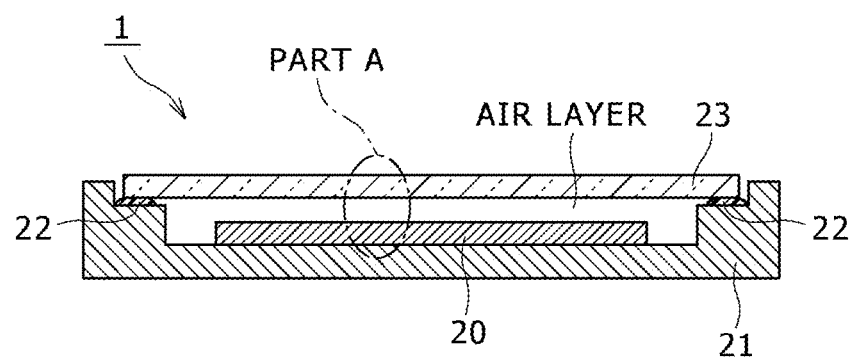
FIG. 2 is a schematic sectional view illustrating a package mounting example of the solid-state image pickup device according to this embodiment.

FIG. 2 is a schematic sectional view illustrating a package mounting example of the solid-state image pickup device according to this embodiment. The solid-state image pickup device 1 has a solid-state image pickup element 20 cut from a wafer after the finish of wafer processing into a chip form, and a package 21 in which to mount the solid-state image pickup element 20. The solid-state image pickup element 20 is adhered and fixed to a mounting part on the inside of a frame part of the package 21, and a transparent substrate 23 is attached to the frame part of the package 21 through a sealing resin 22. Here, an air layer (in some cases it may be filled with a gas such as an inert gas) is provided between the upper side of the solid-state image pickup element 20 and the transparent substrate 23, according to the height of the frame part, whereby the inside of the package is hermetically sealed in the state of a hollow structure. In this instance, if there is no problem about the degree of cleanness of the inside of the package 21, deposition of dust on the solid-state image pickup element 20 inside the package 21 would not be a problem.

[Example of Configuration of Part on Upper Side of Pixel]

Figure 3:
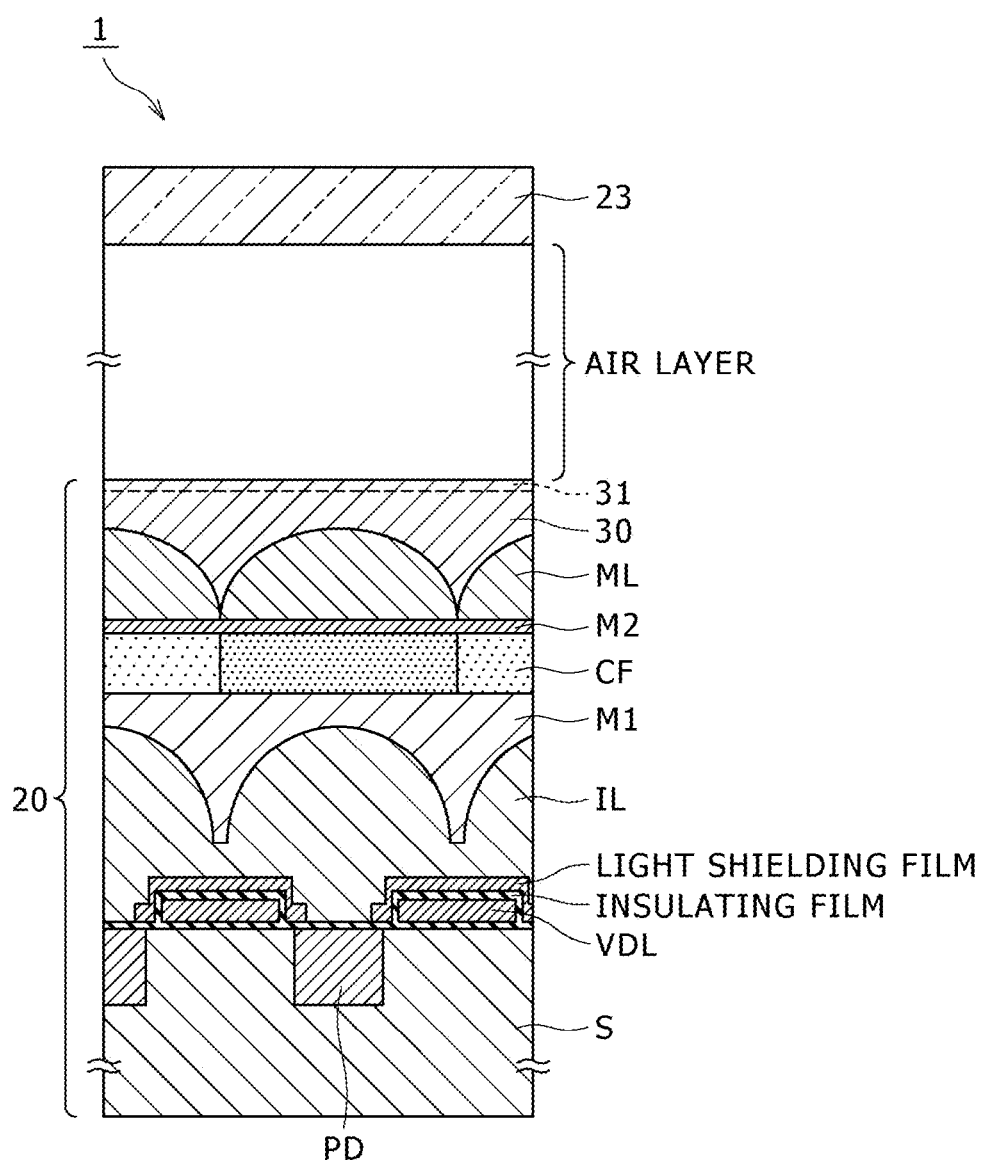
FIG. 3 is a schematic enlarged view of part A of FIG. 2.

FIG. 3 is a schematic enlarged view of part A of FIG. 2. This figure shows a schematic example of the configuration including the range from the surface of a semiconductor substrate S such as a silicon substrate, in the solid-state image pickup device 20, to the transparent substrate 23. The semiconductor substrate S is provided with the light receiving parts PD, and, on the surface of the semiconductor substrate S, the vertical signal lines VDL are formed on both lateral sides of each of the light receiving parts PD. In addition, the vertical signal lines VDL are each covered by a light shielding film through an insulating film therebetween.

On the light shielding film, in-layer lenses IL are formed correspondingly to the positions of the light receiving parts PD, and a first flattening film M1 having a flattened surface is formed on the in-layer lenses IL. On the first flattening film M1, color filters CF are provided correspondingly to the positions of the light receiving parts PD, and microlenses ML are formed on the color filters CF correspondingly to the positions of the light receiving parts PD.

In the solid-state image pickup device according to this embodiment, a protective film 30 is provided which covers the upper side of the microlenses ML and has a flattened surface. The protective film 30 is a film which prevents the uppermost surfaces of convex protuberances of the microlenses ML from being exposed and the surface of which is substantially flat. In addition, at the surface of the protective film 30 is formed a surface film 31 which is higher in hydrophilicity than the inside of the protective film 30. Incidentally, while a film higher in hydrophilic nature than the inside of the protective film 30 is used here as the surface film 31, similar effects can also be obtained when the surface film 31 is a film which is lower in hydrophobic nature than the inside (bulk) of the protective film 30.

In this embodiment, for convenience of description, the surface film 31 is described here to be distinct from the protective film 30. However, the surface film 31 is a film obtained by modifying the surface of the protective film 30. In practice, therefore, the surface film 31 is formed of the same material as the protective film 30, and no interface is present between the surface film 31 and the protective film 30. The absence of any interface there ensures that needless reflection of light would not occur.

The protective film 30 is formed from a fluorine-containing silane compound which is lower than the microlenses ML in refractive index and is good in transparency in the visible region. The protective film 30 may also be formed from a fluorine-containing siloxane resin admixed with silica particulates which have voids therein. The addition of the silica particulates having voids therein ensures that the surface layer formed upon surface modification is higher in hydrophilicity and lower in refractive index, as compared with those in the case where the silica particulates are not added.

In order that the surface film 31 provided at the surface of the protective film 30 is higher in hydrophilicity than the inside of the protective film 30, the surface of the protective film 30 is modified. For instance, the modification is carried out by activating the surface of the protective film 30. Specifically, for example, the surface of the protective film 30 is modified by a plasma treatment using an oxygen-containing gas. The surface film 31 formed by such a modification is lower in fluorine content than the inside (bulk) of the protective film 30 formed from the fluorine-containing resin.

On the upper side of the protective film 30 (surface film 31) configured as above, an air layer is present. Further, on the upper side of the air layer is provided the transparent substrate 23, which is adhered with a sealing resin (not shown). As a result, a solid-state image pickup device of a hollow structure is configured.

[Example of Plan-View Configuration of Chip]

Figure 4:
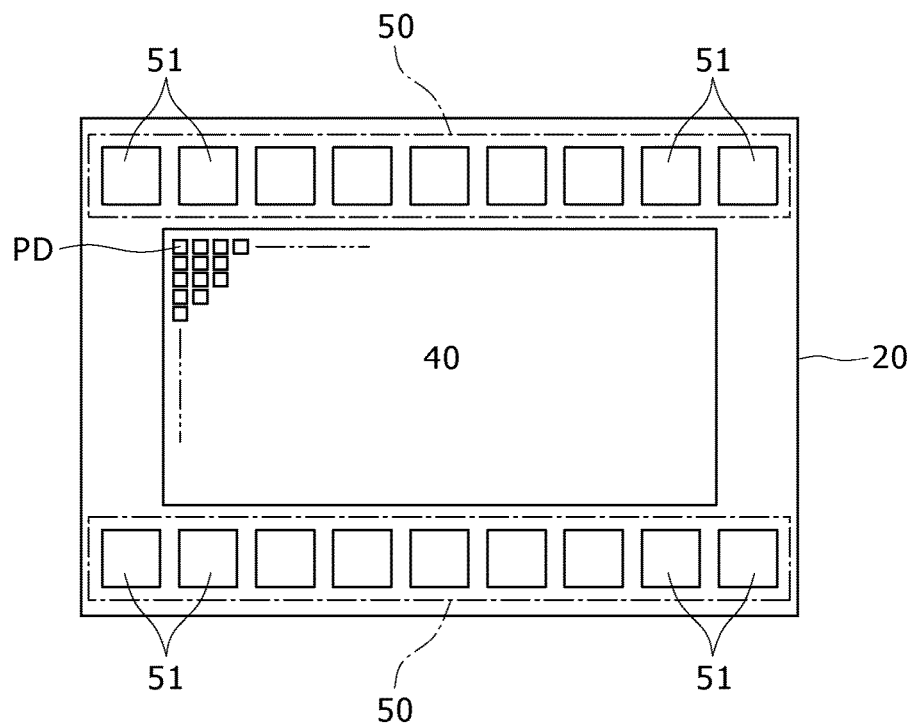
FIG. 4 is a schematic plan view of a configuration example of a chip in the solid-state image pickup device.

FIG. 4 is a schematic plan view of a chip in the solid-state image pickup element. The solid-state image pickup element 20 is provided with a light receiving region 40 in a central part of the chip, and with a bonding pad region 50 in a peripheral part of the chip. In the light receiving region 40 are disposed a plurality of the light receiving parts PD in a matrix (columns and rows) pattern.

In the bonding pad region 50 are disposed a plurality of bonding pads 51. The bonding pads 51 are connection terminals to which to connect bonding wires for connection between an external system and the circuits in the chip. The bonding pads 51 are in connection with a peripheral circuit (not shown) formed in the chip, and are connected to the external system through the bonding wires.

In the solid-state image pickup element 20 used in the solid-state image pickup device according to this embodiment, the protective film is formed at least on the surface of the light receiving region 40, and the above-mentioned surface film is formed at the flattened surface of the protective film. Incidentally, the protective film (surface film) is opened (is provided with openings) where the surfaces of the bonding pads 51 are located.

A plurality of the solid-state image pickup elements 20 are fabricated by use of a wafer at the same time, and, after the wafer process is finished, the wafer is divided by wafer dicing, into the chips. During the wafer dicing, swarf of the silicon substrate or the like is generated from the sections upon cutting by a dicing blade. For removal of the swarf, a cleaning liquid (e.g., washing water) is let flow during the dicing so that the swarf will not be left on the surfaces of the chips. In this embodiment, since the above-mentioned surface film is provided at the surfaces of the solid-state image pickup elements 20 to be diced into the chips, the cleaning liquid in the dicing process flows while making satisfactory contact with the whole area of the chip surfaces due to the hydrophilic nature of the surface film. This ensures that the swarf is washed away together with the cleaning liquid, and the swarf is prevented from remaining on the chip surfaces, particularly on the light receiving regions.

2. Method of Manufacturing Solid-State Image Pickup Device

[Process Flow (No. 1)]

FIGS. 5A to 5G are schematic sectional diagrams for illustrating a process flow (No. 1) of a method of manufacturing a solid-state image pickup device according to this embodiment. In the illustration of the process flow, schematic sectional diagrams pertaining to the light receiving region shown in FIG. 4 are shown on the left side, and schematic sectional diagrams pertaining to the bonding pad region shown in FIG. 4 are shown on the right side.

Figure 5A:
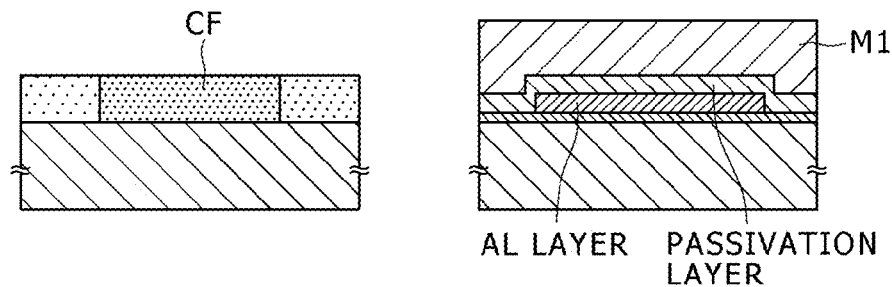
Figure 5B:
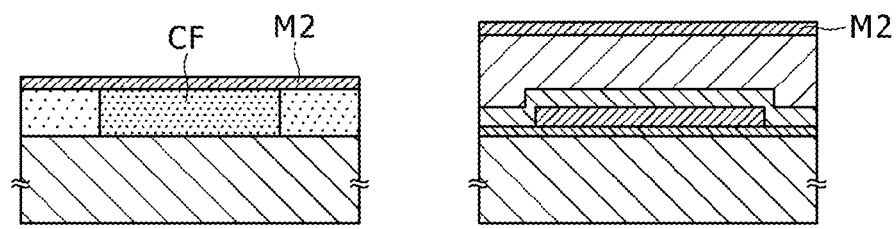

First, as shown in FIG. 5A, the color filters CF are disposed on the pixels in the light receiving region. Next, as shown in FIG. 5B, in order to achieve flattening by burying the stepped portions present at the surfaces of the color filters, a heat treatment at 180 to 230° C. is performed for two to five minutes while using an acrylic thermosetting resin, for example, to thereby dispose a second flattening film M2.

Subsequently, a polystyrene-based positive photosensitive resist containing diazonaphtoquinone as a photosensitive agent (hereinafter referred to as "resist"), for example, is applied to the substrate by a spin coating method at 800 to 200 rpm. Thereafter, a heat treatment at 80 to 110° C. is carried out for 60 to 180 seconds by use of a hot plate, to obtain a film thickness of 0.3 to 1.0 μm.

Next, i-line exposure is conducted using a reduction projection exposure device, and then a developing treatment by a paddle method using, for example, an aqueous 2.38% solution of TMAH (tetramethylammonium hydroxide) is carried out for 40 to 120 seconds. As a result, a resist image corresponding to the areas on the upper side of the pixels is obtained in the light receiving region.

Here, due to the presence of the diazonaphthoquinone photosensitive agent in the above-mentioned resist, absorption in the visible region is provided. Therefore, for example by use of UV rays such as the i-line, the photosensitive agent is decomposed, for enhancing the transmittance in the visible region.

Figure 5C:
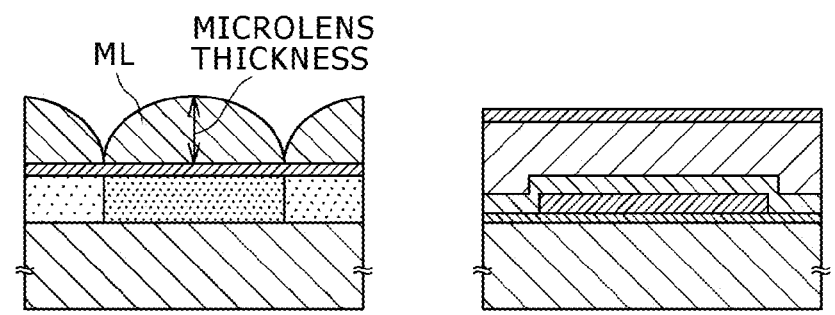

Subsequently, a heat treatment at a temperature of not lower than the heat softening point of the resist is conducted, to obtain the shape of the microlenses ML, as shown in FIG. 5C. The heat treatment in this instance is preferably carried out, for example, on a hot plate at 140 to 200° C. Incidentally, while a method of forming the microlenses ML by a heat treatment method has been described in this process flow, the microlenses ML may be formed through transfer of the lens shape by an etch-back method.

Figure 5D:
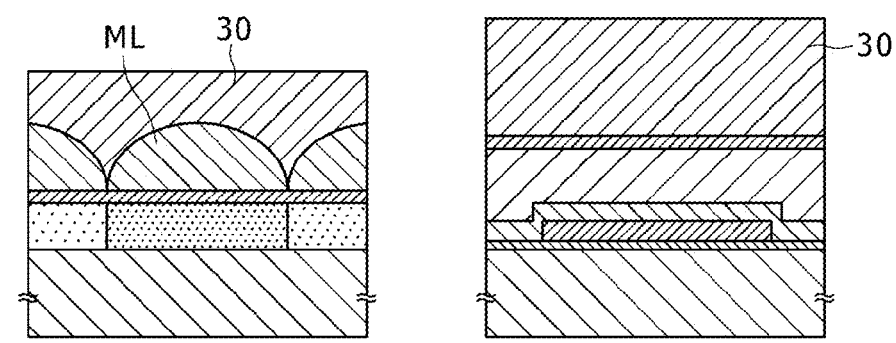

Next, as shown in FIG. 5D, the protective film 30 is formed in the state of burying the ruggedness of the microlens surfaces so that the uppermost surfaces of the convex protuberances of the microlenses ML formed correspondingly to the pixels in the light receiving region will not be left exposed. In addition, the protective film 30 is so formed that its surface is substantially flat.

In this embodiment, a fluorine-containing resin is used to form the protective film 30, and, specifically, a fluorine-containing silane compound is used as the fluorine-containing resin. The fluorine-containing silane compound material is preferably a fluorine-containing siloxane resin, of which the refractive index is lower than that of the microlenses ML. In this embodiment, a protective film 30 formed of the fluorine-containing siloxane resin is disposed to be substantially flat, on the microlenses ML having a thickness of 0.4 μm.

For example, in the case where a polystyrene-based material is used to form the microlenses ML, the refractive index of the material is about 1.60. Taking into account the optical characteristics of the microlenses ML, therefore, the refractive index of the fluorine-containing siloxane resin is preferably 1.30 to 1.44.

In addition, in the case where a film of the fluorine-containing siloxane resin is formed in the state of burying the ruggedness of the surfaces of the microlenses ML and the thus formed film has a substantially flat surface, the light condensing power of the microlenses ML is lowered. As shown in FIG. 3, therefore, the in-layer lens IL may be incorporated between the light receiving part PD and the microlens ML in the structure of the solid-state image pickup element 20.

In this embodiment, for forming the protective film 30 on the microlenses ML, the fluorine-containing siloxane resin is applied at 1500 rpm in such a manner that a film thickness of 0.1 to 1.0 μm is attained after a baking treatment at 200° C. for five minutes. Incidentally, the film thickness of the protective film 30 here means the thickness as measured from the uppermost end of the protuberant form of the microlens ML to the substantially flat surface of the protective film 30. Besides, the thickness of the protective film 30 is preferably so set that the transmission of return light (reflected light generated upon reflection of incident light by the surface of the semiconductor substrate) is minimized by an interference effect.

Incidentally, the conditions shown in the above description are merely an example, and are not limitative. Various conditions such as the viscosity of material, the spinning speed, etc. may be modified according to differences in the thickness of the microlenses and the like.

Subsequently, as shown in FIG. 5E, the positive photosensitive resist is applied. The positive photosensitive resist may be, for example, a resist containing a novolak resin as a main constituent and containing diazonaphthoquinone as a photosensitive agent. The positive photosensitive resist is subjected to exposure and development so that it covers the light receiving region and it is opened where the bonding pad parts and the like (e.g., the parts inclusive of scribe lines and the like) are located. In this instance, the film thickness of the positive photosensitive resist is so set that a residual film is obtained upon dry etching, which is a subsequent step.

Next, as shown in FIG. 5F, with the above-described photosensitive resist as a mask, dry etching is conducted to etch away those portions of a passivation film (e.g., P—SiN film or the like), the first flattening film M1, the second flattening film M2, and the protective film 30 formed of the fluorine-containing siloxane resin which are located in registry with the openings in the photosensitive resist.

The etching conditions to be used in this instance are, for example, as follows.

Etching system: microwave plasma etching system
Magnetron power: 1100 W
Bias power: 40 W
Etching gas (1): $SF_6$ (flow rate: 300 SCCM)
Etching gas (2): $O_2$ (flow rate: 25 SCCM)
Electrode temperature: −30° C.
Pressure inside etching chamber: 2 Pa In addition, the etching system is not limited to the microwave plasma etching system, and applicable examples thereof include other high-density plasma etching systems such as parallel plate RIE system, high-pressure narrow gap plasma etching system, ECR etching system, transformer-coupled plasma etching system, inductively coupled plasma etching system, and helicon wave plasma etching system.

Further, the etching gas species are not limited to $SF_6$ and $O_2$, and other examples thereof include flon gases such as $C_2F_6$, $C_3F_8$, $C_4F_8$, $CH_2F_2$, $CHF_3$, etc., which may be used singly or may be used with $O_2$ and/or such a gas as Ar, He, $N_2$ or the like added thereto.

Subsequently, as shown in FIG. 5G, the positive photosensitive resist having become unnecessary is removed through dissolution by use of an organic solvent.

The organic solvent used in this instance may be, for example, ethyl lactate. The substrate is fixed to a spinner and is rotated at 500 rpm, and, in this condition, the solvent is ejected from a nozzle provided at a central portion of the substrate for 30 seconds. Accordingly, the photosensitive resist is dissolved. Next, the ejection of the solvent is stopped, the rotating speed is raised to 2000 rpm, and rotary drying is conducted for 30 seconds.

The solvent to be used in this treatment is not limited to ethyl lactate. Other examples of the solvent include N-methyl-2-pyrrolidine, γ-butyrolactone, cyclopentanone, cyclohexane, isophorone, N,N-dimethylacetamide, dimethylimidazoline, tetramethylurea, dimethyl sulfoxide, diethylene glycol dimethyl ether, diethylene glycol diethyl ether, diethylene glycol dibutyl ether, propylene glycol monomethyl ether, propylene glycol monoethyl ether, dipropylene glycol monomethyl ether, propylene glycol monomethyl ether acetate, methyl lactate, butyl lactate, methyl 1,3-butylene glycol acetate, 1,3-butylene glycol-3-monomethyl ether, methyl pyruvate, ethyl pyruvate, methyl-3-methoxypropionate, etc., which may be used either singly or in mixture of two or more of them.

The removal of the residual resist through dissolution can be carried out by using one of these solvents or a mixture of two or more of them.

Besides, the method for carrying out the treatment is not limited to the above-mentioned method; for example, a dipping method and the like are also applicable.

By such a step, a film of the fluorine-containing siloxane resin lower than the microlenses ML in refractive index and having good transparency in the visible region is formed as the protective film 30 on the microlenses ML. The protective film 30 is so formed that the uppermost surfaces of convex protuberances of the microlenses ML will not be left exposed and that the ruggedness at the surface of the microlenses ML is buried. The surface of the thus formed protective film 30 is set to be substantially flat, and the protective film 30 is provided with openings in areas where the bonding pad parts are located.

Then, the surface of the protective film 30 formed as above is modified by a treatment to enhance its hydrophilicity. As a result, a surface film higher in hydrophilicity than the inside of the protective film 30 is formed. The modifying treatment is, for example, activation of the surface of the protective film 30 by a plasma treatment using an oxygen-containing gas. An example of treating conditions in this instance is given below.

Apparatus: Microwave plasma ashing apparatus
Microwave power: 1500 W
Oxygen flow rate: 1000 SCCM
Pressure: 100 Pa
Wafer stage temperature: 35° C.
Treating time: 60 seconds Consequently, the surface film higher in hydrophilicity than the inside of the protective film 30 is formed at the surface of the protective film 30. The surface treatment conditions are not limited to the above-mentioned; for example, such a gas as Ar, He, $N_2$, etc. may be added to the $O_2$ gas.

[Process Flow (No. 2)]

FIGS. 6A to 6G are schematic sectional diagrams for illustrating a process flow (No. 2) of the method of manufacturing a solid-state image pickup device according to this embodiment. In the illustration of the process flow, schematic sectional diagrams pertaining to the light receiving region shown in FIG. 4 are shown on the left side, and schematic sectional diagrams pertaining to the bonding pad region shown in FIG. 4 are shown on the right side.

Figure 6A:
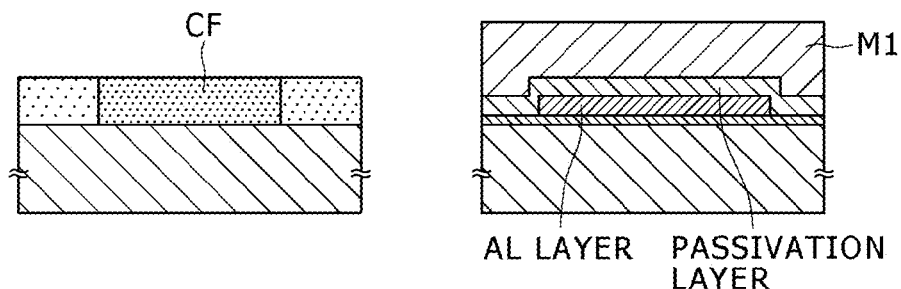
Figure 6B:
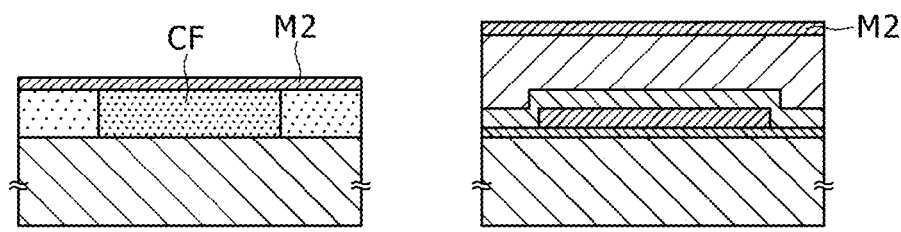

In the process flow (No. 2), the steps shown in FIGS. 6A through 6E are the same as those in the above-described process flow (No. 1). Specifically, as shown in FIG. 6A, color filters CF are provided on pixels in a light receiving region. Then, as shown in FIG. 6B, in order to achieve flattening through burying the stepped portions of the surfaces of the color filters CF, for example, an acrylic thermoplastic resin is used and a heat treatment is carried out at 180 to 230° C. for two to five minutes, to form a second flattening film M2.

Figure 6C:
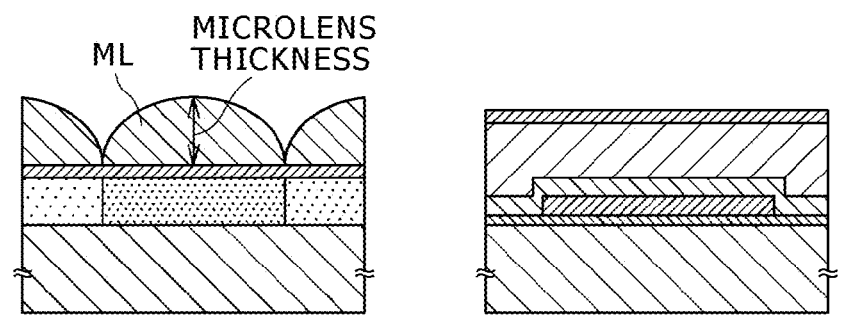

Next, a film of a polystyrene-based positive photosensitive resist containing diazonaphthoquinone as a photosensitive agent (hereinafter, referred to as "resist"), for example, is formed on the substrate. The resist is subjected to exposure using the i-line and then to development. Irradiation with UV rays is conducted for enhancing transmittance, and a heat treatment is carried out, to form microlenses ML as shown in FIG. 6C. Incidentally, while formation of the microlenses ML by a heat treatment method has been described in this process flow, a method of transferring a lens shape by an etch-back technique may also be adopted.

Figure 6D:
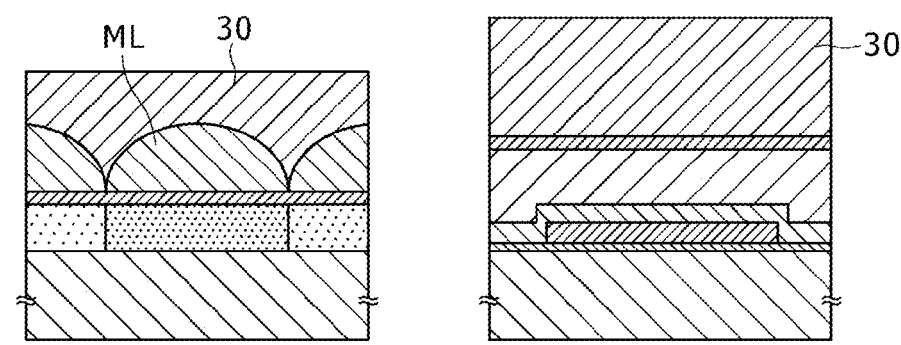

Subsequently, as shown in FIG. 6D, a protective film 30 is formed in the state of burying the ruggedness in the surface of the microlenses ML so that the uppermost surfaces of convex protuberances of the microlenses ML will not be left exposed, and that the surface of the protective film 30 will be substantially flat.

In this embodiment, like in the above-described embodiment, a fluorine-containing resin is used to form the protective film, and, specifically, a fluorine-containing silane compound is used as the fluorine-containing resin. More specifically, the fluorine-containing silane compound material is preferably a fluorine-containing siloxane resin, of which the refractive index is lower than that of the microlenses.

Next, as shown in FIG. 6E, a positive photosensitive resist is applied. As the positive photosensitive resist, for example, a resist containing a novolak resin as a main constituent and diazonaphthoquinone as a photosensitive agent is used. The positive photosensitive resist is subjected to exposure and development in the state of covering the light receiving region and being provided with openings in the areas where bonding pad parts and the like (inclusive of, for example, scribe lines and the like) are located.

The subsequent steps are different from the steps in the above-described process flow (No. 1). As shown in FIG. 6F, with the above-mentioned photosensitive resist as a mask, dry etching is carried out to etch away the first flattening film M1, the second flattening film M2, and the protective film 30 formed from the fluorine-containing siloxane resin. In this case, at the time of etching in the areas of the bonding pad parts, the etching of the positive photosensitive resist is carried out continuously.

Specifically, after those portions of a passivation film which are located on the bonding pads are etched away, the etching gas is changed over, and etching of the positive photosensitive resist is carried out continuously. More specifically, in the condition where the positive photosensitive resist is still remaining or after the resist is etched away, the etching gas is changed over from $SF_6+O_2$ to $O_2$ alone or to an admixture of $O_2$ with such a gas as Ar, He, $N_2$, etc., whereby a surface treatment (modification to hydrophilic state) of the protective film 30 formed from the fluorine-containing siloxane resin is carried out continuously.

This makes it unnecessary to perform removal of the positive resist through dissolution in an organic solvent described in the process flow (No. 1) above. Thus, the surface treatment of the fluorine-containing siloxane resin is carried out in continuity with the step of forming the openings in the areas of the bonding pad parts, whereby the surface film is formed. Accordingly, in the process flow (No. 2), the process can be shortened as compared with the case of the process flow (No. 1).

3. Investigation of Effects of the Embodiment

After the wafer dicing step, foreign matter of several micrometers in size was observed on the fluorine-containing siloxane resin. Particles of the foreign matter were subjected to component analysis using an EDX (energy-dispersive X-ray spectrometer), and the foreign matter was found to be mostly silicon. In general, fluorine-containing resins are known to be water-repellent. In order to elucidate the water repellence phenomenon and investigate the effects of the surface film in this embodiment, the contact angle between the surface of the fluorine-containing resin species and water was investigated. Besides, time variation of the contact angle after the surface treatment of the fluorine-containing resin was also investigated.

[Subject Matter Investigated]

Substrate: Wholly flat bare silicon wafer

Fluorine-containing resin species:

(1) Fluorine-containing siloxane resin-1 (refractive index: 1.42)

(2) Fluorine-containing siloxane resin-2 (refractive index: 1.36; a resin obtained by admixing the resin of (1) with silica particulates having voids therein)

(3) Fluorine-containing acrylic resin (refractive index: 1.42)

Each of the fluorine-containing resins was applied by spin coating to the above-mentioned silicon wafer and baked in such a manner that the film thickness after the baking treatment was 0.5 μm.

Baking conditions:

(1) Fluorine-containing siloxane resin-1: 200° C.×5 minutes (2) Fluorine-containing siloxane resin-2: 200° C.×5 minutes (3) Fluorine-containing acrylic resin: 200° C.×10 minutes The surface treatment of the fluorine-containing resins was conducted under the following conditions.

Apparatus: Microwave plasma ashing apparatus

Microwave power: 1500 W

Oxygen flow rate: 1000 SCCM

Pressure: 100 Pa

Wafer stage temperature: 35° C.

Treating time: 60 seconds

For the fluorine-containing resin species set as above-mentioned, contact angle was measured under the following conditions.

Contact angle measuring method: Contact angle was measured by a water drop method with the following parameters.

Time variation of contact angle was measured without surface treatment after coating (immediately upon coating, and 20 hr/50 hr/100 hr/200 hr after coating)

Time variation of contact angle was measured with above-mentioned surface treatment after coating (immediately upon coating, and 20 hours/50 hours/100 hours/200 hours after coating)

[Investigation Results]

Figure 7A:
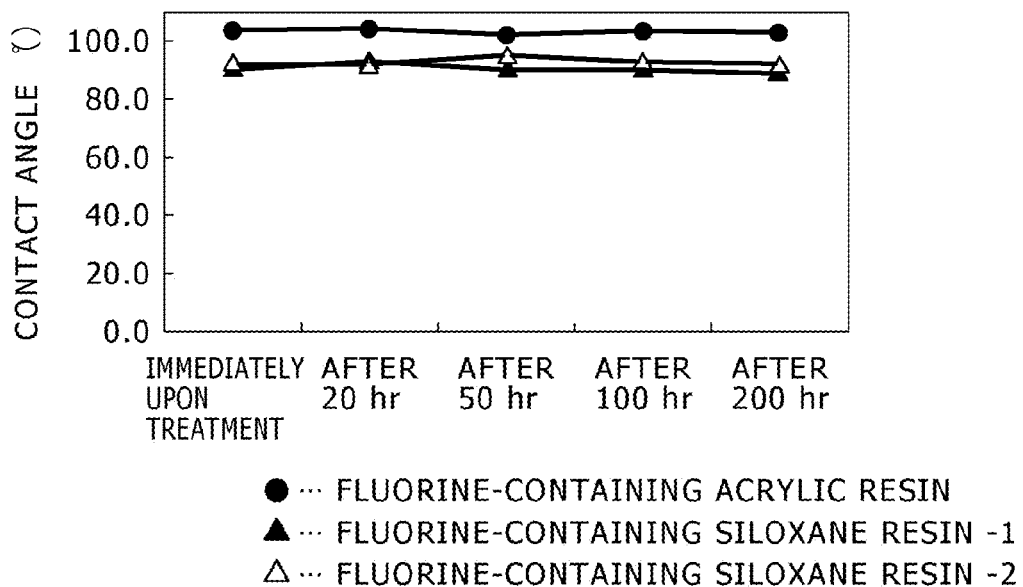
FIGS. 7A and 7B are diagrams showing the results of investigation of variation of contact angle with time.
Figure 7B:
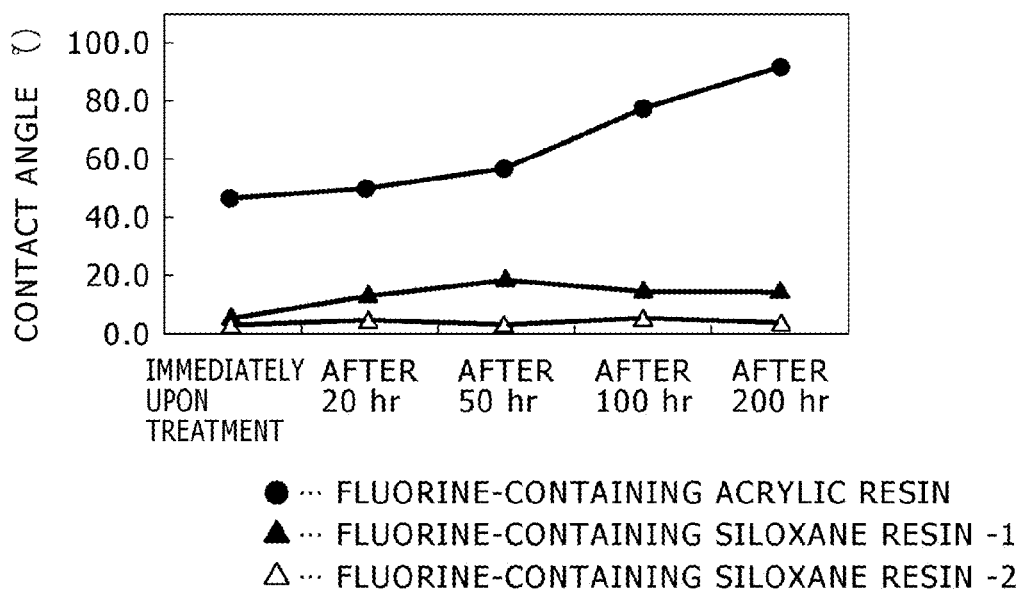
Figure 9A:
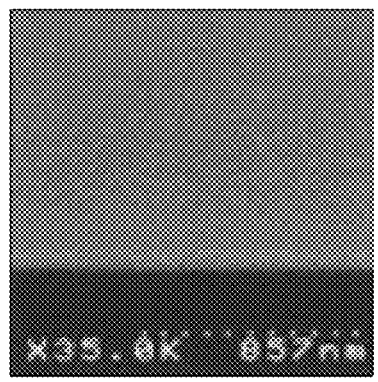
FIGS. 9A to 9C show the surface state upon a surface treatment.
Figure 9B:
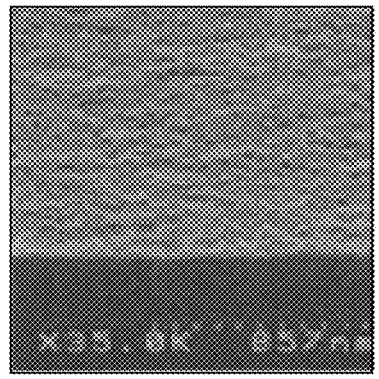

FIGS. 7A and 9B show the investigation results of time variation of contact angle under the above-mentioned conditions, in which FIG. 7A shows the results in the case where no surface treatment was conducted, and FIG. 7B shows the results in the case where a surface treatment (the surface treatment in this embodiment) was conducted. In the diagrams, time is taken on the axis of abscissas, and contact angle on the axis of ordinates.

The investigation results are as follows.

Samples obtained without surface treatment and subjected to measurement of time variation of contact angle between resin and water, as shown in FIG. 7A, give the following results.

(1) Fluorine-containing siloxane resin-1: stable at about 91°.

(2) Fluorine-containing siloxane resin-2: stable at about 93°.

(3) Fluorine-containing acrylic resin: stable at about 103°.

Samples obtained with surface treatment and subjected to measurement of time variation of contact angle between resin and water, as shown in FIG. 7B, give the following results.

(1) Fluorine-containing siloxane resin-1: stable at or below 20°.

(2) Fluorine-containing siloxane resin-2: stable at or below 10°.

(3) Fluorine-containing acrylic resin: Tends to rise from about 50° to about 90°. Specifically 46.4° immediately upon treatment, 49.0° after 20 hours, 57.3° after 50 hours, 77.6° after 100 hours, and 91.3° after 200 hours.

As seen from the investigation results above, the contact angle for each of the fluorine-containing siloxane resin-1 and the fluorine-containing siloxane resin-2 was stable at a value of 10 to 20°. In contrast, the contact angle for the fluorine-containing acrylic resin showed a tendency to rise from 50 to 90° with the lapse of time from immediately upon the surface treatment.

The results of visual observation of wettability during the dicing treatment are set forth in a table shown in FIG. 8. As seen from the table shown in FIG. 8, water repellency was confirmed for each of the resins, in the state before the surface treatment.

The fluorine-containing siloxane resin-1 and the fluorine-containing siloxane resin-2 having undergone the surface treatment showed stable wettability, independently of the lapse of time after the treatment. On the other hand, the fluorine-containing acrylic resin showed slight water repellency after 20 hours from the surface treatment, though it did not show water repellency immediately upon the treatment. After 50 hours, 100 hours, and 200 hours from the surface treatment, the fluorine-containing acrylic resin showed a level of water repellency similar to that of a fluorine-containing acrylic resin not having undergone the surface treatment.

From this evaluation and the above-mentioned evaluation results of contact angle, it has been found that the wettability of the resins during the dicing treatment is lowered starting from a resin-water contact angle of around 50°.

Thus, though the fluorine-containing acrylic resin showed an effect of the surface treatment, the effect was varied with time. In the cases of the fluorine-containing siloxane resin-1 and the fluorine-containing siloxane resin-2, stability of the effect of the surface treatment could be secured, as verified by the investigation results.

Where the surface of the fluorine-containing siloxane resin was subjected to the above-mentioned surface treatment and then to the dicing treatment, no foreign matter was observed on the surface.

Figure 9C:
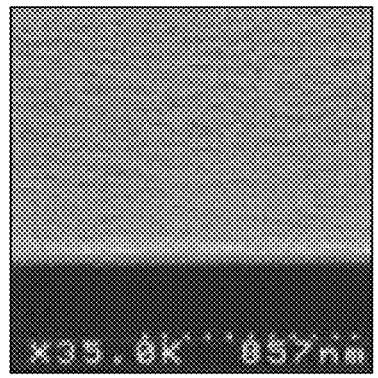

FIGS. 9A to 9C shows the surface states upon the surface treatment, in which FIG. 9A corresponds to the fluorine-containing siloxane resin-1, FIG. 9B to the fluorine-containing siloxan resin-2, and FIG. 9C to the fluorine-containing acrylic resin. With respect to the surface roughness observed under SEM (scanning electron microscope), the fluorine-containing siloxane resin-2 shown in FIG. 9B showed the highest roughness, and the fluorine-containing acrylic resin shown in FIG. 9C showed the second highest roughness. The surface of the fluorine-containing siloxane resin shown in FIG. 9A was in the state of being as smooth as can be observed under SEM.

From the above-mentioned fact that the fluorine-containing siloxane resin-1 and the fluorine-containing siloxane resin-2 having undergone the surface treatment are higher in hydrophilic nature than the fluorine-containing acrylic resin, it is seen that there is no interrelation between the surface condition in roughness and the hydrophilicity.

[Elemental Analysis of Protective Film Surface (Surface Film)]

In the solid-state image pickup device according to this embodiment, the protective film has been surface treated to provide the surface film, wherein the protective film and the surface film can be distinguished from each other by fluorine content. Specifically, the surface film is lower in fluorine content than the inside of the protective film.

FIG. 10 shows an example of elemental concentration ratio in response to the presence or absence of the surface treatment of the protective film, for the fluorine-containing siloxane resin. In the table shown in FIG. 10, the upper part of the column of treatment corresponds to the sample obtained without surface treatment, and the lower part corresponds to the sample obtained with the surface treatment.

The elemental analysis technique adopted here is XPS (X-ray photoelectron spectroscopy), and, as for the depth direction in analysis, a material surface (about 10 nm deep) is measured. This yields such information as constituent elements of the material surface and the chemical bond state there.

As shown in the table in FIG. 10, a conspicuous difference in fluorine content exists between the case where the surface treatment of the fluorine-containing siloxane resin has not been conducted and the case where the surface treatment has been carried out. Specifically, when the surface treatment was not performed, the fluorine concentration was 13.25 atomic %, whereas when the surface treatment was carried out, the fluorine concentration was lowered to 1.94 atomic %. Thus, the surface treatment lowers the fluorine content.

Here, the results obtained without surface treatment correspond to the inside of the protective film, and the results obtained with the surface treatment corresponds to the surface film in the present embodiment. Therefore, the surface film is lower in fluorine content than the inside of the protective film. Accordingly, enhancement of hydrophilic nature is achieved at the surface film.

4. Comparison Between the Related Art and the Embodiment

Here, comparison between the solid-state image pickup device described in Patent Document 3 and the solid-state image pickup device according to this embodiment of the present invention will be described.

Patent Document 3 describes that a fluorine-containing silicone resin excellent in heat resistance is used as the fluorine-containing material, and the surface of the resin is subjected to a plasma treatment using an oxygen-containing gas. By this treatment, alkyl-modified siloxane bonds —SiO—R (R is an alkyl group) present at the outermost resin surface are converted into —SiO$_x$, so as enhance the coatability with the positive resist in a subsequent coating step and the uniformity of the resin layer applied to an upper part thereof. It is also described that it is possible to increase the interfacial adhesion between the fluorine-containing resin material and the resin layer to be formed thereon.

On the other hand, in the structure of the solid-state image pickup device according to this embodiment, no material layer is provided and an air layer is left on the fluorine-containing silane compound to be hollow, and the transparent substrate is provide on the upper side of the air layer. The transparent substrate is sealed to the package by a sealing resin, and, therefore, this structure is different from the structure of the solid-state image pickup device described in Patent Document 3.

In addition, the plasma treatment applied to the surface of the fluorine-containing resin in the solid-state image pickup device according to this embodiment by use of an oxygen-containing gas is aimed at modification of the resin surface. The surface modification here means bringing about a change from water repellency (hydrophobic nature), which is a property peculiar to the fluorine-containing resin, to hydrophilic nature.

Patent Document 3 describes that the outermost surface state of the fluorine-containing resin layer is changed from —SiO—R (R is an alkyl group) to —SiO$_x$. In this embodiment, on the other hand, the surface of the fluorine-containing silane compound is modified from water repellency (hydrophobic nature) to hydrophilicity. This makes it possible to prevent deposition of silicon swarf or the like during the wafer dicing (cutting) step, and to enhance the yield of the solid-state image pickup element. Besides, it is also a characteristic feature of this embodiment that materials having no problem as to coatability with the positive resist applied to the resin are used at the time of processing (opening in the bonding pad areas, or the like) of the fluorine-containing silane compound, and that a plasma treatment using an oxygen-containing gas is carried out during the processing.

Furthermore, in this embodiment, the contact angle between resin and water is quantitatively evaluated by the drop method after the plasma treatment, and time stability of the contact angle (endurance of hydrophilic nature) and plasma durability (etching durability) in the case of using an oxygen-containing gas are taken into account. Based on these, this embodiment utilizes the advantage of using the fluorine-containing silane compound, and, in this point, this embodiment is different from Patent Document 3.

In addition, where microlenses are arranged at the outermost surface of a solid-state image pickup element, ghost may arise from the surface shape and periodicity of the microlenses. Specifically, the light incident on the solid-state image pickup element through a camera set lens or the like is reflected, as diffracted light, by a periodic structure (the microlenses). The light thus reflected is again reflected by an IR cut filter or the camera set lens, to return to the solid-state image pickup element.

In the solid-state image pickup device according to this embodiment, the periodic structure of the outermost surface of the solid-state image pickup element is eliminated, and the substantially flat protective film is disposed at the outermost surface. By this configuration, the above-mentioned diffracted light is reduced, and it is made possible to stably manufacture the solid-state image pickup element.

In this embodiment, the film formed from the fluorine-containing silane compound lower in refractive index than the microlenses of the solid-state image pickup element and having good transparency in the visible region is disposed on the microlenses in such a manner that the uppermost surfaces of convex protuberances of the microlenses are not left exposed and it surface is substantially flat. In addition, the surface of the flat film formed of the fluorine-containing silane compound is subjected to the plasma treatment using an oxygen-containing gas, to modify the surface into a hydrophilic state. As a result, it is possible to prevent deposition of, mainly, silicon swarf during the wafer dicing (cutting) step, and to realize a good device yield. In these points, this embodiment is essentially different from the technology described in Patent Document 3.

5. Examples of Application to Various Microlenses

Figure 11A:
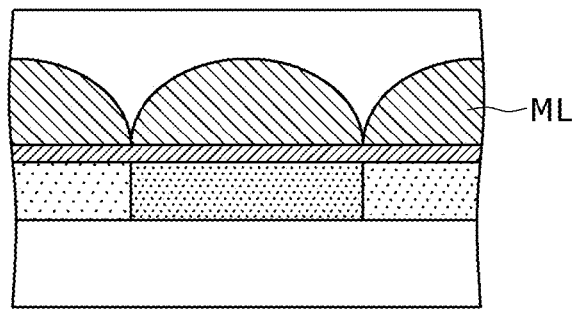
FIGS. 11A to 11D are schematic diagrams for illustrating another example of microlenses.
Figure 11B:
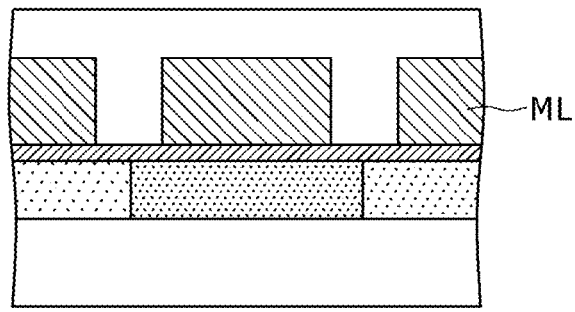
Figure 11C:
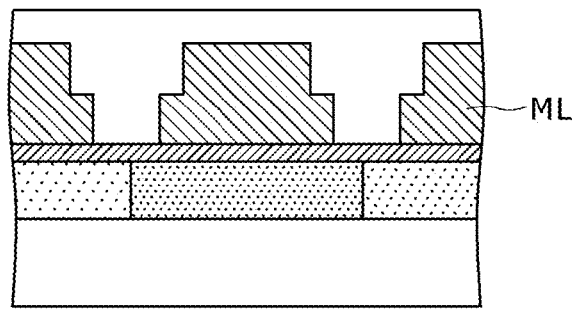
Figure 11D:
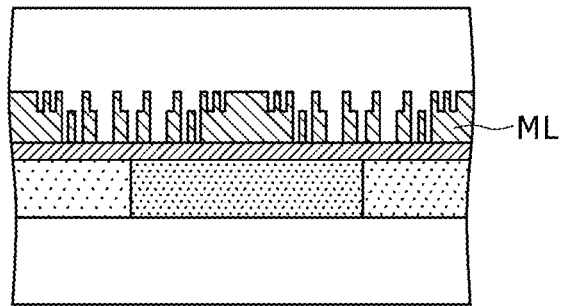

The solid-state image pickup device according to this embodiment as above-described is applicable, irrespectively of the shape of microlenses. Specifically, in order to reduce the ghost which might arise from the surface shape and periodicity of microlenses, it suffices that a low-refractive-index flattening film lower in refractive index than the microlenses and substantially flat is disposed in the form of burying the ruggedness in the shape of the microlenses. For example, the solid-state image pickup device is applicable not only to the spherical lens shown in FIG. 11A but also to aspheric lenses. Besides, the solid-state image pickup device can be applied to rectangular microlenses shown in FIG. 11B, multi-step rectangular microlenses shown in FIG. 11C, and microlenses utilizing diffraction of light shown in FIG. 11D.

6. Electronic Apparatus

FIG. 12 is a block diagram showing a configuration example of an image pickup apparatus as one example of an electronic apparatus according to an embodiment of the present invention. As shown in FIG. 12, the image pickup apparatus 90 has an optical system including a lens group 91, a solid-state image pickup device 92, a DSP (digital signal processor) circuit 93 as a camera signal processing circuit, a frame memory 94, a display device 95, a storage device 96, an operating system 97, a power supply system 98, and the like. Among these components, the DSP circuit 93, the frame memory 94, the display device 95, the storage device 96, the operating system 97 and the power supply system 98 are interconnected through a bus line 99.

The lens group 91 functions to take in the incident light (image light) coming from a subject, and to form an image on an imaging plane in the solid-state image pickup device 92. The solid-state image pickup device 92 converts the quantity of incident light forming the image on the imaging plane under the function of the lens group 91 into an electrical signal on a pixel basis, and outputs the signal as a pixel signal. As the solid-state image pickup device 92, the solid-state image pickup device according to this embodiment as above-described is used.

The display device 95 has a panel type display device such as a crystal display or an organic EL (electroluminescence) display, and displays a motion picture or still picture shot by the solid-state image pickup device 92. The recording device 96 records the motion picture or still picture shot by the solid-state image pickup device 92 into a recording medium such as a nonvolatile memory, a video tape, a DVD (digital versatile disk), etc.

The operating system 97, under the user's operation, issues operation commands as to various functions possessed by the image pickup apparatus. The power supply system 98 appropriately supplies various kinds of electric power for operating the DSP circuit 93, the frame memory 94, the display device 95, the storage device 96 and the operating system 97, to the respective objects.

Such an image pickup apparatus 90 is applied to camera modules for video cameras, digital still cameras and, further, camera modules for mobile apparatuses such as cellular phones. With the solid-state image pickup device according to this embodiment used as the image pickup apparatus 92 as above, generation of noise due to unnecessary dust can be suppressed, and an image pickup apparatus capable of producing high-quality images can be provided.

The present application contains subject matter related to that disclosed in Japanese Priority Patent Application JP 2009-118162 filed in the Japan Patent Office on May 15, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device comprising:
 a solid-state image pickup element operable to produce an electric charge according to the amount of light received;
 a lens disposed on an upper side of a pixel of the solid-state image pickup element;
 a protective film which covers an upper side of the lens and a surface of which is flattened;
 a surface film which is formed at the surface of the protective film and is higher in hydrophilicity than an inside of the protective film; and
 a transparent substrate above the surface film,
 wherein,
  an air layer is formed between the surface film and the transparent substrate,
  the protective film comprises a fluorine-containing silane compound, and
  the surface film is lower in fluorine content than the inside of the protective film.

2. The solid-state image pickup device according to claim 1, wherein the surface film is a film formed by subjecting the surface of the protective film to a plasma treatment using an oxygen-containing gas.

3. The solid-state image pickup device according to claim 1, wherein the thickness of the protective layer is from 0.1 µm to 1 µm.

4. The solid-state image pickup device according to claim 3, wherein the thickness of the protective layer is 0.4 µm.

5. A method of manufacturing a solid-state image pickup device, comprising the steps of:
 forming a lens on an upper side of a pixel of a solid-state image pickup element;
 covering the lens with a protective film and flattening a surface of the protective film;
 forming at the surface of the protective film a surface film which is higher in hydrophilicity than an inside of the protective film; and
 forming a transparent substrate above the surface film,
 wherein,
  an air layer is formed between the surface film and the transparent substrate,
  the protective film comprises a fluorine-containing silane compound, and
  the surface film is lower in fluorine content than the inside of the protective film.

6. The method according to claim 5, wherein the surface film is formed by subjecting the surface of the protective film to a plasma treatment using an oxygen-containing gas.

* * * * *